April 2, 1968 T. L. EMMER 3,376,518

LOW FREQUENCY OSCILLATOR CIRCUIT

Filed May 13, 1964 3 Sheets-Sheet 1

INVENTOR
Thomas Lee Emmer
by Robert L. Slater, Jr.
Attorney

INVENTOR
Thomas Lee Emmer
By Robert L. Slater, Jr.
Attorney

INVENTOR
Thomas Lee Emmer
By Robert L. Slater, Jr.
Attorney

United States Patent Office 3,376,518

Patented Apr. 2, 1968

3,376,518

LOW FREQUENCY OSCILLATOR CIRCUIT

Thomas Lee Emmer, Oak Ridge, Tenn., assignor to Radiation Instrument Development Laboratory, Division of Nuclear-Chicago Corporation, Melrose Park, Ill., a corporation of Delaware Filed May 13, 1964, Ser. No. 366,963
4 Claims. (Cl. 331—111)

This invention relates to low frequency oscillator circuits, and more particularly to an improved variable rate oscillator or waveform generator in which the interval between successive pulses can be varied over a wide range while the output pulse has a waveform and amplitude essentially constant regardless of the pulse repetition rate.

A problem frequently encountered in electronic systems circuit design is the need for a source of relatively low frequency timing pulses. A typical application of such low frequency timing pulses is in the area of nuclear instrumentation wherein low frequency clock pulses are utilized for synchronizing the function of a plurality of separate circuit systems such as in a multi-channel pulse height analyzer system adapted for use in neutron activation spectography. In the aforementioned application pulse repetition rates may be required over a range from less than 0.01 cycle per second to over 100 cycles per second. Stated in another way, the pulse repetition rate range should include one pulse every one hundred seconds to over one hundred pulses per second. In addition, the design requirements for the aforementioned applications are such that the timing pulse repetition rate must be constant and very stable once set to a predetermined value; that is to say, the frequency of the oscillator or pulse generator output should not vary appreciably as a function of small changes in such parameters as ambient temperature and changes in component values as a result of aging. In addition, it is desirable that the output pulse repetition rate should be continuously adjustable over a wide range of frequencies with provisions for rapidly changing the pulse repetition rate to predetermined and accurately reproducible values. Furthermore, the waveform and amplitude of the output pulse should be essentially constant over the full range of operating frequencies.

It is also desirable to utilize solid state components such as germanium and silicon transistors and diodes. Although solid state components have operating characteristics as well as physical factors which are both desirable on the one hand and undesirable on the other, their advantages generally outweigh their disadvantages. As an illustration, it is possible to achieve very low power drain requirements and relatively low thermal dissipation by utilizing transistors in place of vacuum tubes. In addition, transistorized circuits require significantly less physical space than comparable vacuum tube circuits. However, transistors are notorious for introducing problems of temperature stability and, in the case of low frequency and direct coupled circuits, the problem of DC drift is significant. Prior art oscillators of the type described have many objectionable characteristics. Among these characteristics the most significant are low frequency instability or DC drift, frequency wander, and the need for relatively complex circuits to compensate for the aforesaid characteristics.

Taking into consideration the above limitations of prior art oscillators, it is a primary object of my invention to provide a stable low frequency oscillator utilizing solid state components in a relatively simple circuit.

It is another object of my invention to provide a stable low frequency pulse generator circuit which provides output pulses having a shape and amplitude essentially independent of the pulse repetition rate.

It is still another object of my invention to provide a stable low frequency oscillator having a long term stability better than one part in two thousand.

It is still another object of my invention to provide a stable low frequency oscillator circuit having a plurality of predetermined frequency settings and having means for rapidly changing the frequency to the desired setting.

The aforesaid objects as well as other objects and advantages of my invention are further disclosed in the following specification and illustrated in the accompanying drawings, wherein.

Figure 1:
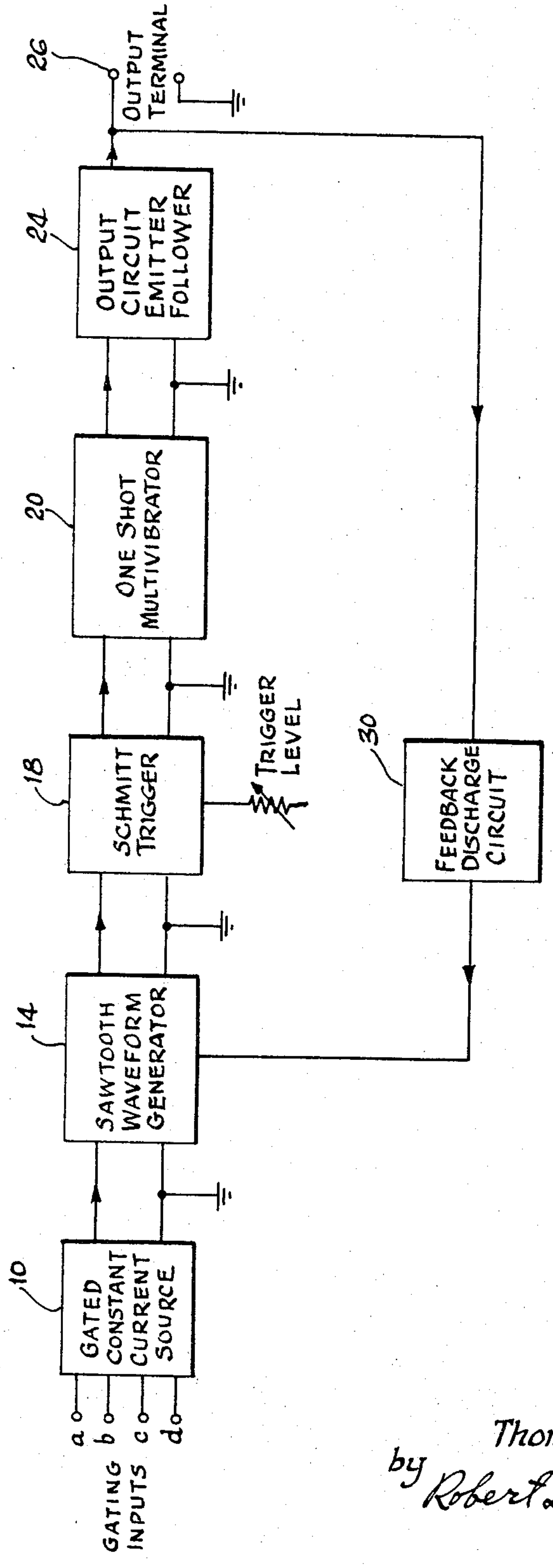
FIGURE 1 is a block diagram of one preferred embodiment of my invention.

Referring to the embodiment of my invention shown in the block diagram of FIGURE 1, a gated constant current source 10 is provided with a plurality of gating inputs *a*, *b*, *c*, and *d*. An output current from the constant current source 10 is fed into a sawtooth waveform generator 14 which functions to generate a time linear ramp voltage waveform. The linear ramp voltage waveform or sawtooth waveform is fed directly to the input of a conventional Schmitt trigger circuit 18. The trigger level threshold of the Schmitt trigger circuit 18 may be continuously adjusted over a range of trigger levels with the result that when the linear ramp voltage waveform reaches the trigger level of the Schmitt trigger circuit, an output pulse is produced by the trigger circuit. The output pulse from the trigger circuit 18 is fed into a one shot multivibrator 20 designed to function as a pulse shaper and further designed to isolate the Schmitt trigger circuit 18 from the output circuit 24. The multivibrator 20 is triggered on in response to the leading edge of the output pulse from the Schmitt trigger circuit 18 and, in turn, generates a positive going pulse which is fed directly to the output circuit 24 and appears at the output terminal 26. Thereafter, the output pulse which appears at the output terminal 26 is fed to the input of the feedback discharge circuit 30. The discharge circuit 30 is adapted to discharge the sawtooth waveform circuit 14 to a fixed reference base line from which the charging circuit will again resume generation of the sawtooth voltage waveform. As will be described below, the frequency of the oscillator circuit may be changed by selecting a given constant current charge rate from the constant current source that may be gated through one of the plurality of gating input terminals *a*, *b*, *c*, *d*. Although only four gating inputs are shown, it is understood that any number of gating inputs may be provided. The constant current source is designed to provide a different current rate and, therefore, a different sawtooth slope as a function of the particular gating input signal applied to one of the gating input terminals. In addition, the threshold level of the Schmitt trigger circuit 18 is provided with adjustable means for varying its trigger level, and thereby selecting the portion of the sawtooth waveform voltage slope which will trigger the Schmitt trigger circuit. Thus, two means are provided for selecting the oscillator pulse repetition rate. Rapid and relatively large changes of the oscillator frequency can be effected by gating on a different constant current rate from the constant current source 10, which changes the slope of the sawtooth waveform. Finer adjustments of the oscillator frequency can be effected by adjusting the trigger level of the Schmitt trigger which changes the point on the sawtooth waveform which activates the trigger mechanism.

Figure 2:
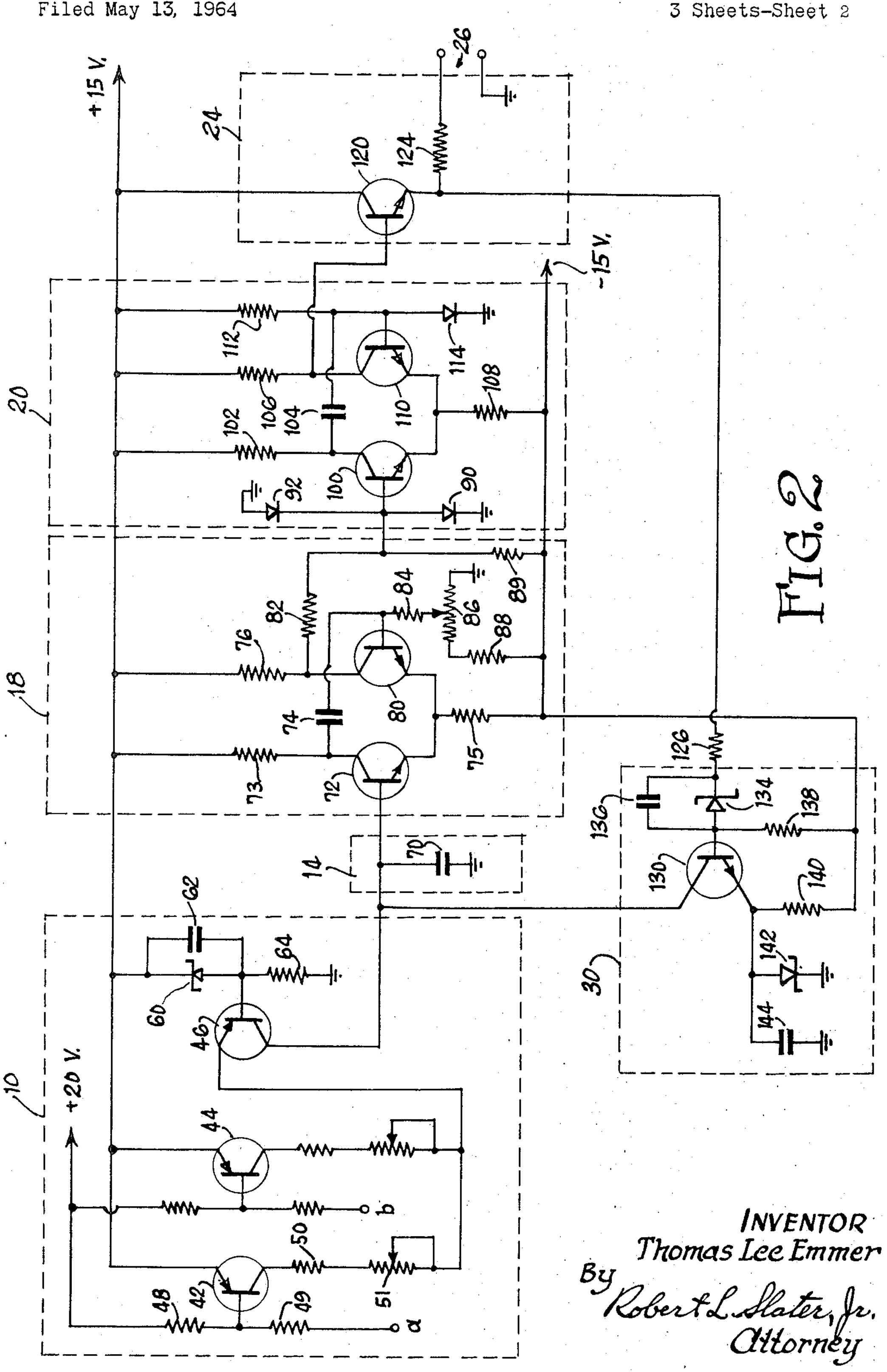
FIGURE 2 is a schematic circuit diagram of the embodiment illustrated in FIGURE 1.

FIGURE 2, showing the circuit details of the oscillator of FIGURE 1, will now be described. The constant current source 10 includes two transistors, 42 and 44, which are connected in a voltage divider arrangement. The base of transistor 42 is connected to a +20-volt bus through resistor 48. In addition, the base of transistor 42 is connected through resistor 49 to a gating terminal *a*. The emitter of transistor 42 is directly connected to a +15-volt bus. The collector of transistor 42 is connected through a series resistor network comprising resistor 50 and variable resistor 51. Resistance 51 is a linear potentiometer which is used to regulate the collector current of transistor 42 and, in turn, the emitter current of transistor 46, the function of which will be described below. The movable arm of the linear potentiometer 51 is connected to one side of the potentiometer and is also connected to the emitter of a constant current generator comprising transistor 46. Transistor 44 is connected in the same manner as transistor 42 and provisions are made for applying a gating pulse to terminal *b* for gating transistor 44. It can be seen that a plurality of transistors connected in a manner similar to transistor 42 and transistor 44 can be included, each having a separate gating terminal input. However, for purposes of simplicity only two such stages are shown. The base of transistor 46 is connected to the +15-volt bus through a 5.6 volt Zener diode 60 which is by-passed by capacitor 62. The current necessary to bring diode 60 into the Zener region of conduction is provided by resistor 64 which is connected between the base of transistor 46 and ground. The linear potentiometer 51 in the collector circuit of transistor 42 may be adjusted to determine the current at the emitter of transistor 46, when transistor 42 is gated to conduction by the application of a −10-volt signal applied to gating terminal *a*. In order to gate transistor 42 to the "off" state, a +10-volt quiescent bias is maintained at the gating terminal. In a like manner transistor 44 may be gated to the "on" position by the application of a −10-volt signal applied to gating terminal *b*. Likewise, transistor 44 is normally gated off by means of a quiescent bias of +10 volts. Additional parallel gated transistors not shown may be added and will function in the aforedescribed manner.

Using transistor 42 for purposes of illustration, the linear potentiometer 51 may be adjusted to control the current at the emitter of transistor 46 as previously described. Once the operating point of transistor 46 is determined by the setting of potentiometer 51, the collector current of transistor 46 is essentially constant regardless of the collector voltage. The collector of transistor 46 is connected to the sawtooth generator 14 which comprises an integrating capacitor 70. Capacitor 70 is preferably a superior quality low leakage capacitor. The integrating capacitor 70 is connected between the collector lead of transistor 46 and ground. Since it is assumed that the collector current $I_c$ from transistor 46 is constant and since the charge Q on a capacitor is equivalent to the product of the capacitance C and the charging voltage E, it follows that $$\frac{dQ}{dt}=I_c=C\frac{dE}{dt}$$

Therefore, since the current $I_c$ is constant and C is constant, the time rate of change of the voltage on the capacitor as seen from the collector of transistor 46 is constant. It follows that when either of the gating transistors 42 or 44, respectively, are forward biased and, therefore, conducting, transistor 46 will, in turn, conduct, and the collector current from transistor 46 will generate a linear ramp waveform voltage or sawtooth waveform across capacitor 70.

As shown in FIGURE 2 the collector of transistor 46 is coupled directly to the base of paired transistors 72 and 80 which comprise the voltage discriminator or Schmitt trigger circuit 18. The collector of transistor 72 is connected to the +15-volt bus through resistor 73 and is connected through capacitor 74 to the base of transistor 80. Emitters of both transistors 72 and 80 are connected directly together and in common through resistor 75 to the −15-volt power supply bus. The base of transistor 80 is connected through resistor 84 to the movable arm of linear potentiometer 86. One end of linear potentiometer 86 is connected to ground and the other end of linear potentiometer 86 is connected through resistor 88 to the −15-volt bus. A resistor 82 is connected between the collector of transistor 80 and the base of transistor 100. The output signal from the Schmitt trigger circuit is developed across resistor 76 which is connected between the +15-volt bus and the collector of transistor 80.

Transistors 100 and 110 comprise the one shot multivibrator circuit 20. A diode 90 is connected between the base of transistor 100 and ground. Likewise, a second diode 92 is connected between the base of transistor 100 and ground. The cathode of diode 90 is connected to the base of transistor 100 and the anode of diode 92 is connected to the base of transistor 100. The purpose of the diodes is to prevent overdriving the one shot multivibrator, the input of which is highly current sensitive and which will normally require a voltage input trigger signal of only several tenths of a volt. The base of transistor 100 is also connected to the −15-volt bus through resistor 89. A resistor 102 is connected between the collector of transistor 100 and the +15-volt bus. The collector of transistor 100 is also connected to the base of transistor 110 through the capacitor 104. Emitters of both transistors 100 and 110 are directly connected together and then through resistor 108 to the −15-volt bus. The base of transistor 110 is clamped to ground by means of diode 114 which is connected between the base of transistor 110 and ground. The output signal of the one shot multivibrator is developed across resistor 106 which is connected between the +15-volt bus and the collector of transistor 110. The collector of transistor 110 is also connected directly to the base of the output emitter follower transistor 120. The collector of transistor 120 is connected directly to the +15-volt bus. The emitter of transistor 120 is connected through resistor 124 to output terminal 26, and is also connected through resistor 126 to the anode of a 5.6-volt Zener diode 134.

The discharge circuit 30 as shown includes transistor 130, the collector of which is directly connected to the collector of transistor 46. The base of transistor 130 is connected to the −15-volt power supply bus through resistor 138, and is also connected to the cathode of a 5.6-volt Zener diode 134. Zener diode 134 is by-passed by capacitor 136. The current necessary to bring diode 134 into the Zener region of conduction is supplied through resistor 140 which is connected between the emitter of transistor 130 and the −15-volt bus. The emitter of transistor 130 is connected to the 12.0-volt Zener diode 142 and by-pass capacitor 144.

Figure 3:
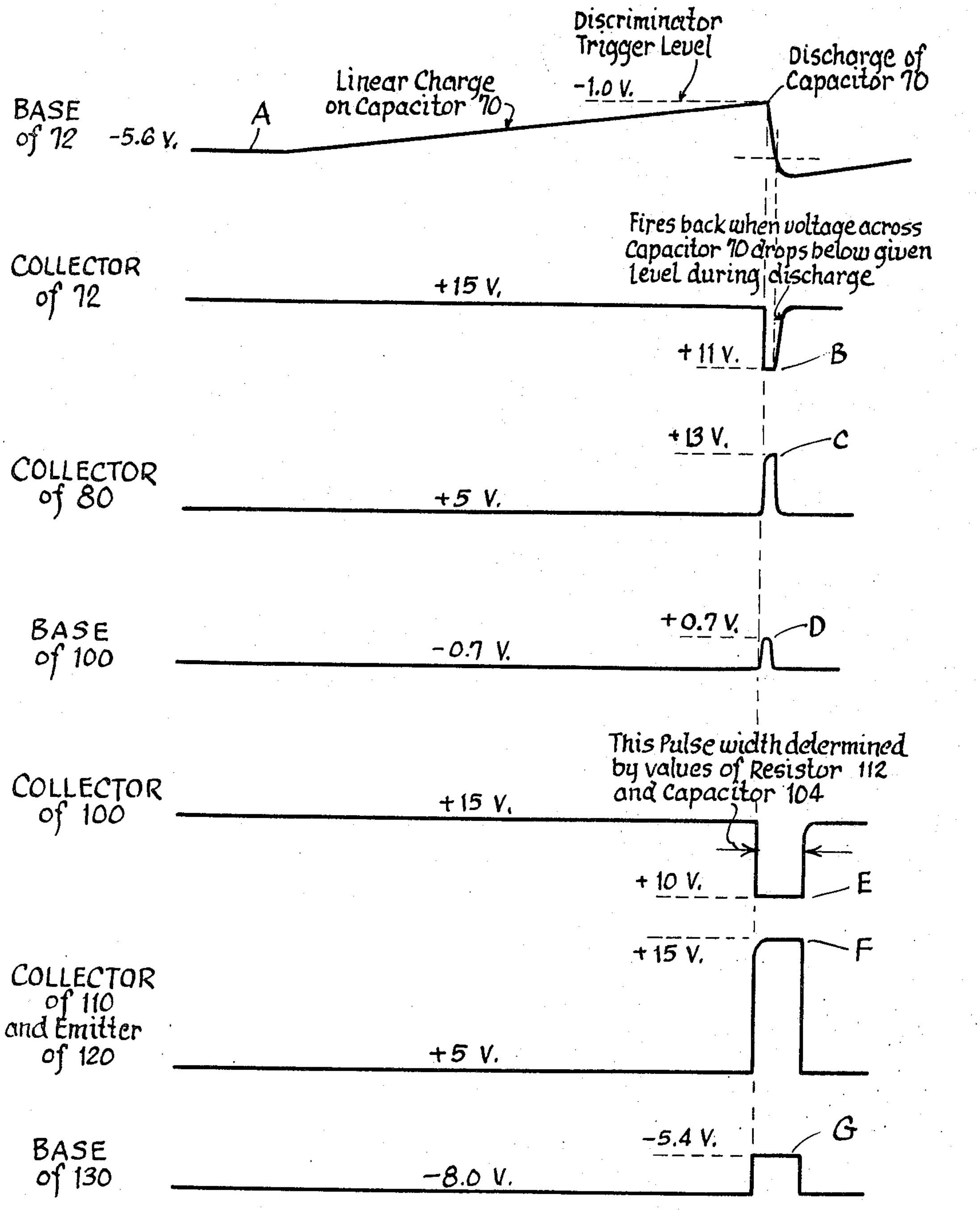
FIGURE 3 shows typical signal waveforms occurring in the operation of the circuit of FIGURE 2.

In order to more fully illustrate the operation of the oscillator circuit, representative voltage waveforms generated by the circuit of FIGURE 2 have been chosen for a typical pulse generating cycle and which waveforms have been illustrated in FIGURE 3. Reference will now be made to the circuit of FIGURE 2 and the waveforms illustrated in FIGURE 3. Operation of the circuit is as follows:

It is initially assumed that the oscillator is gated off by the application of a steady +10-volt bias on the gating input terminals *a* and *b*. When it is desired to start the oscillator, a −10-volt signal is applied to the desired gating terminal, in this case terminal *a*. Upon application of the −10-volt gating signal to terminal *a*, transistor 42 will be forward biased into saturation causing the collector voltage of transistor 42 to become +15 volts. The collector current of transistor 42 flows through the series combination of resistors 50 and 51, respectively, and to the emitter of transistor 46. The base of transistor 46 is continuously clamped to a fixed voltage level above electrical ground determined by the Zener diode 60. In the circuit as shown the base of transistor 46 will be maintained at +9.4 volts above ground. With the base of transistor 46 securely clamped to a constant potential and the collector of transistor 42 clamped to +15 volts by saturation, a constant current will flow through the series resistors 50 and 51. Therefore, the emitter current of transistor 46 will be constant and the collector current of transistor 46 will also be constant regardless of the change in voltage across capacitor 70 due to the minor effect of changes in collector voltage when in clamped base operation. Accordingly, and as previously described, capacitor 70 will begin to charge in a time linear voltage curve or sawtooth, the start of which is shown at A in FIGURE 3.

The sawtooth voltage waveform thus generated across capacitor 70 appears at the input of the Schmitt trigger 18. When the voltage level across capacitor 70 reaches the trigger threshold the Schmitt trigger will respond by generating an output pulse. For purposes of illustration, the input trigger level of the Schmitt trigger is shown as occurring at approximately −1.0 volt. However, it is understood that the trigger threshold level is variable and may be continuously adjusted from approximately −2.5 volts to 0 volts by means of the setting of potentiometer 86 in the base circuit of transistor 80.

At the instant the Schmitt trigger fires, the collector of transistor 72 is driven from +15 volts to +11 volts shown at B. Immediately thereupon the collector of transistor 80 swings from +5 volts to +13 volts, generating a momentary 8 volt output pulse across resistor 76 shown at C.

The output pulse C from the Schmitt trigger is shaped by a second pair of transistors respectively, 100 and 110, which comprise a one shot multivibrator. The positive going output pulse from the Schmitt trigger is applied to the base of transistor 100. In the quiescent state the base of transistor 100 rests at a potential of aprproximately −0.7 volt. The output pulse from the Schmitt trigger raises the potential of the base of transistor 100 to approximately +0.7 volt shown at D. Diodes 90 and 92 prevent the base of transistor 100 from being driven to either excessive negative or positive potentials in order to prevent current saturation of the one shot multivibrator. The change in the base voltage of transistor 100 at D causes the collector of transistor 100 to swing from a quiescent potential of +15 volts to +10 volts, thus generating a negative going pulse of −5 volts across resistor 102 shown at E. This pulse cuts off transistor 110 and causes the collector of transistor 110 to swing from a resting potential of approximately +5 volts to a momentary peak of +15 volts, thereby generating a positive going output pulse of +10 volts across resistor 106 shown at F. The time period during which transistor 110 is cut off is determined by capacitor 104 and resistor 112 and is sufficiently long to allow the ramp capacitor 70 to be completely discharged, as will be described in further detail below. Since the base of the emitter-follower output stage comprising transistor 120 is directly connected to the collector of transistor 110, it will, in turn, have the same pulse shape F. The emitter-follower action of transistor 120 will not invert the output signal but will function to feed pulse F to output terminal 26. Therefore, the output signal from the oscillator will be a positive pulse having an amplitude of approximately 10 volts from a low impedance source.

The output signal is also fed back through series resistor 126, Zener diode 134, and capacitor 136 to the base of transistor 130. In the absence of an output pulse signal from the emitter-follower output transistor 120, the base of transistor 130 rests at −8.0 volts. As a result of the foregoing bias, transistor 130 is normally reverse biased and, therefore, cut off. However, at the instant an output pulse from the emitter-follower output transistor 126 is applied to the base of transistor 130 through resistor 126, diode 134 and capacitor 136, transistor 130 is driven into conduction shown at G. When transistor 130 is thus forward biased and in hard conduction, capacitor 70 will discharge through the collector current flow. Zener diode 142 in the emitter circuit of transistor 130 assures that the capacitor 70 will be consistently discharged to the fixed reference voltage of −5.6 volts below ground.

When the output pulse F falls to +5 volts, determined by the time constant at the base of transistor 110, transistor 130 is once again cut off and no longer conducts. Thereupon, capacitor 70 is, in turn, supplied with the constant current from transistor 46 and begins a new linear sawtooth charge cycle. The interval between successive output pulses is determined by the slope of the linear sawtooth waveform and by the setting of the Schmitt trigger voltage level. It is apparent that the output pulse is wholly determined by the parameters of the pulse shaper circuit comprising the one shot multivibrator 20 and is, therefore, independent of the pulse repetition rate.

When the discharge current from transistor 130 causes the voltage across capacitor 70 to drop sufficiently, the Schmitt trigger returns to the normal condition, i.e., with transistor 80 conducting. The use of the one shot multivibrator circuitry, as described above, is to generate a pulse sufficiently wide to completely discharge capacitor 70 and to provide a constant width output pulse. The foregoing is illustrated by considering the case if the output pulse B directly from the Schmitt trigger is utilized to discharge the capacitor 70. It is apparent from the waveforms that capacitor 70 would not completely discharge since the Schmitt trigger would fire back to the normal condition as soon as the sawtooth voltage across the capacitor dropped a few tenths of a volt below the Schmitt trigger discrimination level on discharge.

In order to ensure long term stability of the above oscillator circuit, it is desirable that the +15-volt, −15-volt, and +20-volt busses be supplied from a source of stable constant potential such as a well regulated power supply, not shown. In addition, it is understood that the above potentials are all referred to electrical ground as symbolized on the illustrations.

While the principles of my invention have been described above in connection with a specific embodiment thereof, it is to be clearly understood that the foregoing description is made only by way of example rather than limitation on the scope of my invention.

What is claimed is:

1. A low frequency oscillator circuit for generating a series of electrical pulses comprising a plurality of gated constant current means, a source of gating pulses, an integrating capacitor, means for applying said gating pulses to one of said constant current means for selecting a predetermined constant current value therefrom, the constant current means being adapted to charge the capacitor to a linear sawtooth waveform, discharge means for abruptly periodically discharging the capacitor to a fixed reference potential, voltage discriminator means being connected to the integrating capacitor and adapted to respond to a voltage level across the capacitor exceeding a predetermined threshold value by generating a pulse signal, pulse shaper means being connected to the output of the voltage discriminator and adapted to respond to the pulse signal from the discriminator by generating an output signal, the discharge means being connected between the pulse shaper and the integrating capacitor adapted to discharge the capacitor to the fiexed reference potential in response to the output signal.

2. A circuit for generating low frequency electrical pulse signals comprising a plurality of gated constant current means, a source of gating signals, means for applying said gating signals to a selected constant current means for generating a predetermined value of constant current flow therefrom, an integrating capacitor, the constant current means being adapted to charge the capacitor to a time linear sawtooth waveform, discharge means for abruptly periodically discharging the capacitor to a fixed reference potential, Schmitt trigger means having an input and having an output, the input being connected to the integrating capacitor and adapted to respond to a voltage level across the capacitor exceeding a predetermined threshold value by generating a pulse signal at the output, a one shot multivibrator having an input and having an output, the input being connected to the output of the Schmitt trigger and adapted to respond to the pulse signal from the Schmitt trigger by generating a constant width output signal, an emitter-follower output circuit having an input and having an output, the input being connected to the output of the multivibrator, the discharge means being connected between the output of the emitter-follower and the integrating capacitor whereby the capacitor is completely discharged to the fixed reference potential in response to the output signal from the emitter-follower.

3. The circuit set forth in claim 2 wherein the constant current means includes a first transistor and a second transistor, said transistors having a base, collector and emitter, a resistor connected to the source of gating signals, the base of the first transistor being connected to said resistor, the emitter of the first transistor being connected to a constant potential bus, variable resistor means being connected between the collector of the first transistor and the emitter of the second transistor, a Zener diode and a resistor connected between a constant potential bus and ground, the base of the second transistor being connected to the junction of the Zener diode and the resistor, the output of the constant current means being derived from the collector of the second transistor, said integrating capacitor being connected between the collector of said second transistor and ground.

4. The circuit set forth in claim 2 wherein the Schmitt trigger is provided with adjustable threshold trigger level means for controlling the firing point of the Schmitt trigger such that the frequency of the pulse repetition rate is continuously variable.

References Cited

UNITED STATES PATENTS 3,156,875 11/1964 Fiorino et al. -------- 331—111

ROY LAKE, *Primary Examiner.*

NATHAN KAUFMAN, *Examiner.*

S. H. GRIMM, *Assistant Examiner.*